(12) United States Patent
Woll et al.

(10) Patent No.: US 12,362,404 B2
(45) Date of Patent: Jul. 15, 2025

(54) METHOD AND APPARATUS FOR OPERATING AN EARLY WARNING SYSTEM FOR ROBUSTLY DETECTING AN ERROR OF AN ELECTRICAL ENERGY STORE FOR A DEVICE BY MEANS OF MACHINE LEARNING METHODS

(71) Applicant: Robert Bosch GmbH, Stuttgart (DE)

(72) Inventors: Christoph Woll, Gerlingen (DE); Christian Simonis, Leonberg (DE); Csaba Domokos, Simmozheim (DE)

(73) Assignee: Robert Bosch GmbH, Stuttgart (DE)

( * ) Notice: Subject to any disclaimer, the term of this patent is extended or adjusted under 35 U.S.C. 154(b) by 477 days.

(21) Appl. No.: 17/937,489

(22) Filed: Oct. 3, 2022

(65) Prior Publication Data

US 2023/0104003 A1   Apr. 6, 2023

(30) Foreign Application Priority Data

Oct. 4, 2021 (DE) ...................... 10 2021 211 158.0

(51) Int. Cl.
| | |
|---|---|
| *H01M 10/48* | (2006.01) |
| *G01R 31/367* | (2019.01) |
| *G01R 31/392* | (2019.01) |
| *G06N 3/088* | (2023.01) |
| *G07C 5/08* | (2006.01) |
| *H01M 10/42* | (2006.01) |
| *G07C 5/00* | (2006.01) |

(52) U.S. Cl.
CPC .......... *H01M 10/48* (2013.01); *G01R 31/367* (2019.01); *G01R 31/392* (2019.01); *G06N 3/088* (2013.01); *G07C 5/0808* (2013.01); *H01M 10/4285* (2013.01); *G07C 5/008* (2013.01); *H01M 2220/20* (2013.01)

(58) Field of Classification Search
None
See application file for complete search history.

(56) References Cited

U.S. PATENT DOCUMENTS

2024/0044988 A1\* 2/2024 Yamasaki ............ G01R 31/392

FOREIGN PATENT DOCUMENTS

| DE | 10 2020 215 378 A1 | 6/2022 |
|---|---|---|
| JP | 2021-129404 A | 9/2021 |

\* cited by examiner

*Primary Examiner* — Jas A Sanghera
(74) *Attorney, Agent, or Firm* — Maginot, Moore & Beck LLP

(57) ABSTRACT

A computer-implemented method for determining an error of a behavior of an electrical energy store in a technical device includes sensing an operating variable profile of at least one operating variable of the electrical energy store, determining at least one operating feature from the operating variable profile of the at least one operating variable of the electrical energy store, and evaluating a variational autoencoder with a supplied input variable vector, which includes an operating feature point from the at least one operating feature, in order to determine a degree of deviation from a distribution in a latent state space or a reconstruction error. The method further includes detecting the error of the behavior depending on (i) the degree of deviation or the reconstruction error, and (ii) a predetermined error threshold.

15 Claims, 6 Drawing Sheets

METHOD AND APPARATUS FOR OPERATING AN EARLY WARNING SYSTEM FOR ROBUSTLY DETECTING AN ERROR OF AN ELECTRICAL ENERGY STORE FOR A DEVICE BY MEANS OF MACHINE LEARNING METHODS

This application claims priority under 35 U.S.C. § 119 to patent application no. DE 10 2021 211 158.0, filed on Oct. 4, 2021 in Germany, the disclosure of which is incorporated herein by reference in its entirety.

The disclosure relates to network-independently operated, electrical devices with electrical energy stores, in particular to electrically drivable motor vehicles, in particular electric vehicles or hybrid vehicles, and furthermore to measures for detecting an anomaly of an electrical energy store.

BACKGROUND

The supply of energy to network-independently operated, electrical devices and machines, such as electrically drivable motor vehicles, takes place by means of electrical energy stores, typically device batteries or vehicle batteries. The latter supply electrical energy for operating the devices. However, energy converters, such as fuel cell systems, including hydrogen tanks, also come into consideration as electrical energy stores.

Electrical energy stores or energy converters degrade over their service life and depending on their load or usage. This so-called aging leads to a continuously decreasing maximum power or storage capacity. The aging state corresponds to a measure for indicating the aging of energy stores. According to the convention, a new energy store has an aging state, e.g., SOH-C, i.e., with respect to its capacity of 100%, the value of which decreases noticeably over the course of its service life. A lower value of the aging state thus indicates a higher degree of aging. The degree of aging of the energy store (change in the aging state over time) depends on an individual load on the energy store, i.e., in the case of vehicle batteries of motor vehicles, on the usage behavior of a driver, external ambient conditions and on the type of vehicle battery.

SUMMARY

According to the disclosure, a method for determining an anomaly of the behavior of an electrical energy store as well as an apparatus for determining an anomaly of the behavior of an electrical energy store in an electrically operable device are provided.

According to a first aspect, a computer-implemented method is for determining an error of the behavior of an electrical energy store in a technical device (4); comprising the following steps: (i) sensing an operating variable profile of the at least one operating variable of the electrical energy store; (ii) determining at least one operating feature from the operating variable profile of the at least one operating variable of the electrical energy store; (iii) evaluating a variational autoencoder with a supplied input variable vector, which comprises an operating feature point from the at least one operating feature, in order to determine a degree of deviation from a distribution in a latent state space or a reconstruction error; (iv) detecting an error depending on the degree of deviation or the reconstruction error and furthermore depending on a predetermined error threshold; and (v) signaling the error.

Energy stores within the meaning of this specification include device batteries, energy conversion systems with an electrochemical energy converter with an energy carrier supply, such as fuel cell systems with a fuel cell and an energy carrier supply.

In order to determine aging states, operating variables of energy stores in a plurality of devices are continuously sensed and evaluated in a central unit. The operating variables may include an instantaneous energy store current, an instantaneous energy store voltage, an instantaneous energy store temperature and/or an instantaneous energy store state of charge. According to the above method, it is furthermore possible to detect an anomaly of the energy store by additional evaluation based on the operating variable profiles in an external central unit or in the relevant device.

The aging state of an electrical energy store, in particular a device battery, is usually not directly measured. This would require a number of sensors inside the energy store that would make the production of such an energy store costly, as well as complex, and would increase the space requirement. Moreover, measurement methods suitable for everyday use for direct determination of the aging state in the energy stores are not yet available on the market. The current aging state of an electrical energy store is therefore typically determined by means of a physical aging model in a central unit separate from the energy store.

Due to the inaccuracy of the physical aging model, it can moreover only somewhat accurately indicate the instantaneous aging state of the energy store. An aging state prediction, which would in particular depend on the mode of operation of the energy store, such as the magnitude and amount of charge inflow and charge outflow in a device battery, and thus on usage behavior and usage parameters, would lead to very inaccurate predictions and is currently not provided.

In the case of device batteries, the aging state (state of health, SOH) is the key variable to indicate a remaining battery capacity or remaining battery charge. The aging state represents a measure of the aging of the device battery. In the case of a device battery or a battery module or a battery cell, the aging state may be indicated as a capacity retention rate (SOH-C). The capacity retention rate SOH-C is given as the ratio of the measured instantaneous capacity to an initial capacity of the fully charged battery. Alternatively, the aging state may be given as an increase in internal resistance (SOH-R) with respect to internal resistance at the start of the service life of the device battery. The relative change in the internal resistance SOH-R increases with increasing aging of the battery.

Promising are approaches to provide user-specific and usage-specific modeling and prediction of a load profile and the accompanying aging state of the electrical energy store based on an aging state model that uses the profiles of operating variables from the time of the initial operation to adjust the aging state, in each case, time step by time step, starting from the aging state at the time of the initial operation. This aging state model can be implemented purely based on data but also as a hybrid data-based aging state model. Such an aging state model may, for example, be implemented in a central unit (cloud) and are parameterized or trained by means of operating variables of a plurality of energy stores of various devices that are in communication connection with the central unit.

Aging state models for determining aging states for electrical energy stores may be provided in the form of a hybrid aging state model, i.e., a combination of a physical aging model with a data-based model. In a hybrid model, a physical aging state may be determined by means of a physical or electrochemical aging model, and a correction value resulting from a data-based correction model may be applied to said aging state, in particular by addition or multiplication. The physical aging model is based on electrochemical model equations that characterize electrochemical states of a non-linear differential equation system, calculate them continuously, and maps them to the physical aging state for output, as SOH-C and/or as SOH-R. The calculations can typically be performed in the cloud, e.g., once a week.

Furthermore, the correction model of the hybrid data-based aging state model may be designed with a probabilistic or artificial intelligence-based data-based regression model, in particular a Gaussian process model, and may be trained to correct the aging state obtained by the physical aging model. For this purpose, there is consequently a data-based correction model of the aging state for correcting the SOH-C and/or at least one further model for correcting the SOH-R. Possible alternatives to the Gaussian process are further supervised learning methods, such as a random forest model, AdaBoost model, support vector machine, or a Bayesian neural network.

The correction model is configured to determine the correction variable based on operating features that are determined by feature extraction based on signal processing from the profiles of the operating variables of one or more of the device batteries and may also comprise one or more of the internal electrochemical states of the differential equation system of the physical model. In particular, the at least one operating feature may be determined as an aggregate variable from the operating variable profile of the at least one operating variable of the electrical energy store. The operating features may furthermore comprise features relating to the evaluation period and/or accumulated features and/or statistical variables determined over the entire previous service life.

The calculation of the physical/electrochemical aging model together with the correction model preferably takes place externally to the device in a central unit (cloud) since it is computationally intensive and the required processing power in the battery-operated devices or in hardware close to the battery-operated devices is often not sufficient or is not to be provided for cost reasons. The time profiles of the operating variables are therefore continuously transmitted to an external central unit, and operating features for determining the aging state, e.g., according to the electrochemical model and the correction model, are determined therefrom there. The operating features thereby characterize the load on the relevant energy store since its initial operation by cumulating or aggregating the load determined by the operating variable profiles.

While an erroneous behavior of the energy store or functional errors can only be detected early with difficulty on the basis of the operating variable profiles, an ascertained abnormal load can be detected and signaled early as an anomalous behavior of the energy store on the basis of non-matching or abnormal characteristics of operating features, specifically with respect to their combination. According to the above method, the one or more of the operating features are thus to be used to ascertain an anomaly of an energy store. As the at least one feature for the evaluation to determine an anomaly, at least one operating feature determined from the operating variable profile of the at least one operating variable of the electrical energy store may be determined as an aggregate variable.

In this regard, a variational autoencoder is provided, which can to be trained, in particular in an unsupervised manner and be regularly or continuously updated in particular by means of operating feature points of a plurality of energy stores that operate without errors or have been operated without errors or failures in the past (e.g., up to 3 months ago). An anomaly of a device battery can thus be determined on the basis of an evaluation of a degree of deviation of a distribution in the latent state space of the variational autoencoder or a reconstruction error. To this end, at the same time as determining the current aging state by means of the hybrid aging state model, the operating features of the relevant device battery may, for example, be at least partially used to perform the anomaly detection.

The training of the variational autoencoder takes place so that an encoder is trained to determine a distribution of the training data in a latent state space based on a loss function that takes into account a Kullback-Leibler divergence. Overfitting of the latent state space is thereby avoided.

In a training data set, derived from a latent variable, the probabilistic encoder may be defined by (z|x) and a probabilistic decoder may be defined by x̂~p(x|z)).

Based on the set of Bayes, the following is obtained $$p(z|x) = \frac{p(x|z)p(z)}{p(x)} = \frac{p(x|z)p(z)}{\int p(x|z)dz} = \frac{p(x|z)p(z)}{\int p(x|z)p(z)dz}$$

where p(x) cannot be solved. Thus, (z|x) is approximated by $q(z|x) \equiv N(\mu_x, \sigma_x)$, which corresponds to a Gaussian distribution, where $\mu_x$ and $\sigma_x$ indicate the mean and variance, respectively, depending on x.

It is furthermore assumed that $p(z) \equiv N(0, I)$ corresponds.

A solvable variational inference may be performed to determine $\mu_x$ and $\sigma_x$ by minimizing the Kullback-Leibler divergence:

$$(\mu_x, \sigma_x) \in \mathrm{argmin} KL(q(z|x)\|p(z|x)) =$$
$$\mathrm{argmin} E_{z\sim q(z|x)}\left[\log q(z|x) - E_{z\sim q(z|x)}\left[\log \frac{p(x|z)p(z)}{p(x)}\right]\right] =$$
$$\mathrm{argmin} E[\log q(z|x)] - E[\log p(x|z)] - E[\log p(z)] + E[\log p(x)] =$$
$$\mathrm{argmin} E_{z\sim q(z|x)}[\log p(x|z)] - KL(q(z|x)\|p(z)) =$$
$$\mathrm{argmin} E[\log q(z|x)] - E[\log p(x|z)] - E[\log p(z)] + E[\log p(x)] =$$
$$\mathrm{argmin} E_{z\sim q(z|x)}[\log p(x|z)] - KL(q(z|x)\|p(z))$$

The first term represents the reconstruction probability that penalizes the reconstruction error, and the second term ensures that the distribution (z|x) resembles the true prior distribution of p(z).

The loss function 1 to be minimized is defined for an in particular predetermined c>0 as follows:

$$l = c\|x - \hat{x}\|^2 + KL(N(\mu_x, \sigma_x)\|N(0, I))$$

The training takes place based on training data sets with operating feature points where the loss function is successively minimized by training decoder and encoder by means of conventional training methods.

An anomaly can be detected with the variational autoencoder by evaluating, for an operating feature point to be evaluated, a degree of deviation of a distribution in the latent state space or a reconstruction error from operating features determined from operating variable profiles of an energy store. In particular, an anomaly may be detected when a reconstruction error is detected that is greater than a predetermined error threshold. The error threshold results from an evaluation of the available training data.

Advantageously, the degree of deviation may also be determined as a Mahalanobis distance between a centroid of the latent state vectors, which result from the evaluations of the input variable vectors of the training data sets in the trained variational autoencoder, and the latent state vector for the input variable vector to be evaluated. Advantageously, the degree of deviation may, for example, also be determined as a Euclidean distance between the centroid of the latent state vectors, which result from the evaluations of the input variable vectors of the training data sets in the trained variational autoencoder, and the latent state vector for the input variable vector to be evaluated. Furthermore, the reconstruction error may additionally or alternatively also be determined as a Euclidean distance between an output variable vector of the variational autoencoder and the input variable vector to be evaluated.

It may be provided that the predetermined error threshold is determined on the basis of an acceptable predetermined false-positive probability, wherein the false-positive probability indicates a relative limit value, what proportion of the evaluations may maximally result in an incorrectly detected error, wherein a frequency distribution is determined from the frequencies of occurrence of a particular value (or value range) of the reconstruction error in an evaluation of available training data sets, wherein the error threshold results as the value of the reconstruction error that is less than the reconstruction errors of a number of training data sets that corresponds to a proportion of all the available training data sets that corresponds to the predetermined false-positive probability.

Furthermore, following the presence of field data of errors in energy stores, the predetermined error threshold may be determined on the basis of a false-positive frequency distribution and a false-negative frequency distribution resulting from the training data sets of error-free energy stores.

In particular after the training process of the variational autoencoder, the error threshold for detecting an anomaly is thus calibrated on the basis of a predetermined probability of false-positive detection. For example, in the case of a maximum false-positive probability of 1%, a limit value may be determined as the design parameter for evaluating a frequency distribution. The frequency distribution results from the frequencies of training data sets on the determined degree of deviation, which advantageously corresponds to the Mahalanobis distance, evaluated in the latent state space (latent space). From the distribution of the degree of deviation or of the reconstruction error, the error threshold results as the value of the degree of deviation or of the reconstruction error that is less than the degrees of deviation or the reconstruction errors of a number of training data sets that corresponds to a proportion of all training data sets that corresponds to the predetermined probability of the false-positive detection. The probability may be calculated, for example, by integration over the probability density function of the frequency distribution.

The error threshold is re-determined after each re-training of the variational autoencoder based on the corresponding training data sets.

By comparing the reconstruction error with the predetermined error threshold, an anomaly can be detected in operation. An error can be detected if the reconstruction error exceeds the error threshold.

Alternatively, an anomaly can be detected with the variational autoencoder by evaluating, for an operating feature point to be evaluated, a distribution in the latent state space in particular by means of the Mahalanobis distance from operating features determined from operating variable profiles of an energy store. In particular, an error can be detected if the degree of deviation is greater than a predetermined error threshold. Alternatively or additionally, the degree of deviation may be evaluated on the basis of the reconstruction errors of the variational autoencoder.

It may likewise be provided in this case that the predetermined error threshold is determined on the basis of an acceptable predetermined false-positive probability, wherein the false-positive probability indicates a relative limit value, what proportion of the evaluations may maximally result in an incorrectly detected error. To this end, the Mahalanobis distance in the latent state space (of the latent state vector) is determined between a centroid of the latent state vectors, which result from the evaluations of the input variable vectors of the training data sets in the trained variational autoencoder, and the latent state vector for each input variable vector to be evaluated of the training data sets. The error threshold results as the value of the Mahalanobis distance that is less than the Mahalanobis distances of a number of training data sets that corresponds to a proportion of all the available training data sets that corresponds to the predetermined false-positive probability.

In particular after the training process of the variational autoencoder, the error threshold for detecting an anomaly on the basis of a predetermined probability of false-positive detection of, e.g., 1% is thus determined as the design parameter for evaluating a degree of deviation, such as the Mahalanobis distance.

Alternatively or in addition to the deviation analysis in the latent state space, from the distribution of the reconstruction errors, the value of the reconstruction error that is less than the reconstruction errors of a number of training data sets that corresponds to a proportion of all training data sets that corresponds to the predetermined probability of the false-positive detection may be taken into account as the error threshold. The probability may be calculated, for example, by integration over the frequency distribution.

The method for evaluating the reconstruction error may be performed internally in the device or externally in the central unit. A detected anomaly in one of the energy stores can be appropriately signaled by the device or the central unit, e. by a monitoring tool, by a mobile device, or the like. For example, a warning message may be output to a user of the relevant device operated with the energy store.

Furthermore, it may be provided that an error is only signaled if a plausibility condition for the presence of the error is fulfilled. An error is thus only signaled if the error is harmful.

Moreover, a frequency of execution of the method for determining the error can be selected depending on the magnitude of the reconstruction error or the magnitude of the degree of deviation, such as the Mahalanobis distance in the latent state space.

It may be contemplated that the method is performed in the respective device, wherein the variational autoencoder is in particular regularly retrained externally and resulting model parameters of the variational autoencoder are transmitted to the technical device, where the interpretation of the model parameters and the execution of the method for error detection and anomaly prediction are performed. In particular, the predetermined error threshold may be determined externally after an update and transmitted to the respective device in order to be used there to determine an error.

An aging state model that furthermore uses the at least one operating feature to determine an aging state in a data-based model may be provided.

According to one embodiment, signaling the error may include an automated shutdown of the device or the transitioning of the energy store into a safe state, in particular via rapid discharge, or a scheduling of a workshop visit for inspection.

The energy store may be used to operate a device, such as a motor vehicle, a pedelec, an aircraft, in particular a drone, a machine tool, a consumer electronics device, such as a mobile phone, an autonomous robot, and/or a household appliance.

According to a further aspect, an apparatus is for determining an anomaly of the behavior of an electrical energy store in a technical device; wherein the apparatus is designed for: (i) sensing an operating variable profile of the at least one operating variable of the electrical energy store; (ii) determining at least one operating feature from the operating variable profile of the at least one operating variable of the electrical energy store; (iii) evaluating a variational autoencoder with a supplied input variable vector, which comprises an operating feature point from the at least one operating feature, in order to determine a degree of deviation from a distribution in a latent state space or a reconstruction error; (iv) detecting an error depending on the degree of deviation or the reconstruction error and furthermore depending on a predetermined error threshold; and (v) signaling the error.

BRIEF DESCRIPTION OF THE DRAWINGS

Preferred embodiments are described in more detail below with reference to the accompanying drawings. Here.

DETAILED DESCRIPTION

In the following, the method according to the disclosure is described with reference to vehicle batteries as electrical energy stores in a plurality of motor vehicles as similar devices. In the motor vehicles, a data-based aging state model for the respective vehicle battery, in the scope of which operating features for operating the vehicle battery are determined, may be implemented in a control unit. These operating features are advantageously suited for performing anomaly detection.

The example described herein is representative of a plurality of stationary or mobile devices with a network-independent energy supply, such as vehicles (electric vehicles, pedelecs, etc.), systems, machine tools, household appliances, IOT devices, and the like, which are connected via a corresponding communication connection (e.g., LAN, Internet) to an external central unit (cloud).

For the method described herein, the determination of the aging state is not essential but provides the possibility of using the operating features used therein for the method for anomaly detection.

Figure 1:
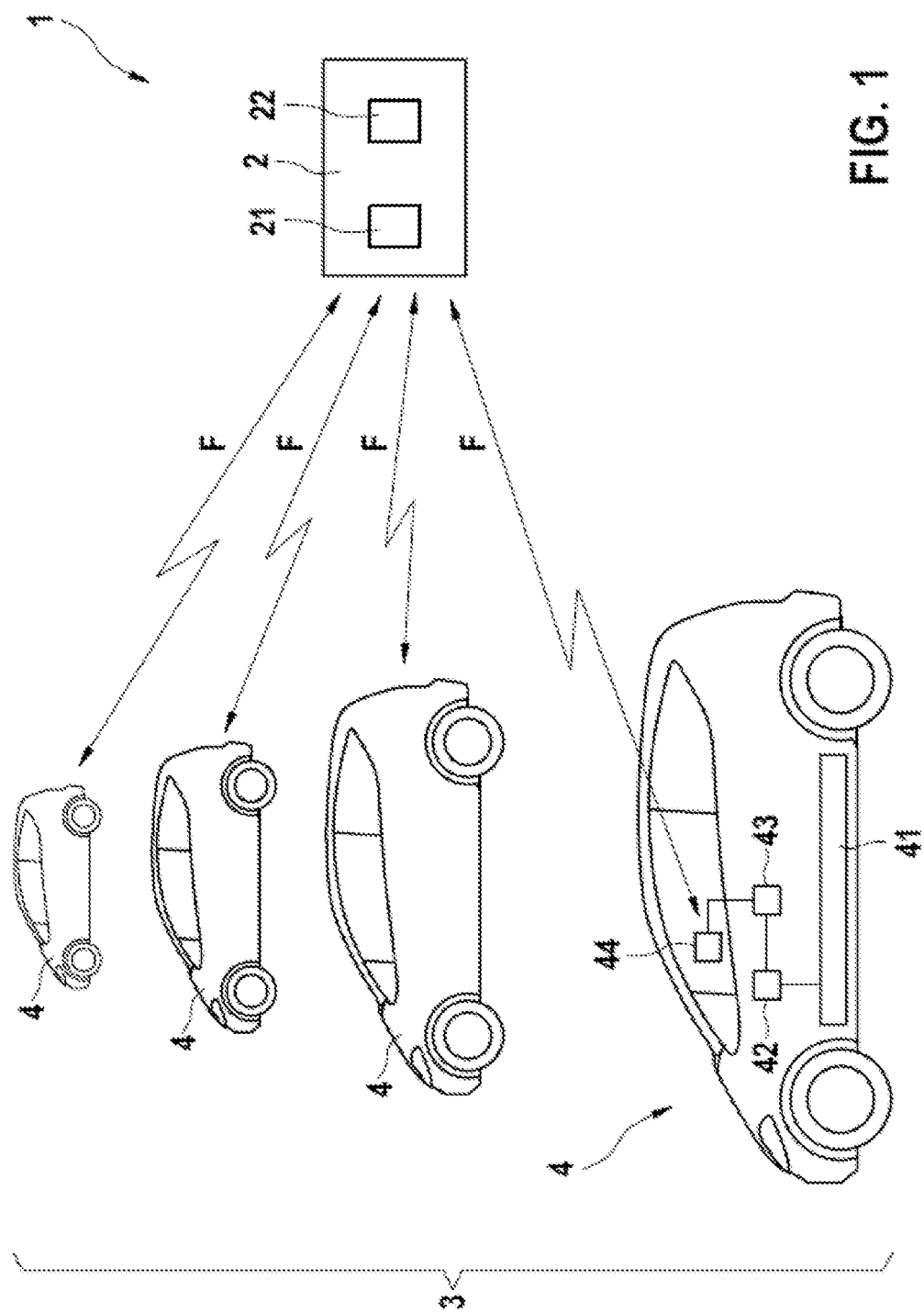
FIG. 1 shows a schematic illustration of a system for providing driver-specific and vehicle-specific operating variables for determining an aging state and for performing anomaly detection of a vehicle battery in a central unit.

FIG. 1 shows a system 1 for collecting fleet data in a central unit 2 for creating and for operating as well as for evaluating an aging state model and for performing anomaly detection. The aging state model is used to determine an aging state of an electrical energy store, such as a vehicle battery or a fuel cell in a motor vehicle. FIG. 1 shows a vehicle fleet 3 with a plurality of motor vehicles 4.

One of the motor vehicles 4 is shown in more detail in FIG. 1. The motor vehicles 4 each comprise a vehicle battery 41 as a rechargeable electrical energy store, an electric drive motor 42 and a control unit 43. The control unit 43 is connected to a communication module 44, which is suitable for transmitting data between the respective motor vehicle 4 and a central unit 2 (a so-called cloud).

The motor vehicles 4 send to the central unit 2 the operating variables F, which indicate at least variables from which the loaded state of the vehicle battery 41 can be derived. In the case of a vehicle battery, the operating variables F can indicate an instantaneous battery current, an instantaneous battery voltage, an instantaneous battery temperature and an instantaneous state of charge (SOC), at the pack, module and/or cell level. The operating variables F are sensed in a fast time grid from 0.1 Hz to 100 Hz and can be transmitted regularly to the central unit 2 in uncompressed and/or compressed form. For example, by using compression algorithms, the time series may be transmitted to the central unit 2 in blocks at intervals of 10 min to several hours in order to minimize the data traffic to the central unit 2.

The central unit 2 comprises a data processing unit 21, in which the method described below can be performed, and a database 22 for storing data points, model parameters, states, and the like.

Models, such as an anomaly detection model and an aging state model, which may be partially data-based as a hybrid model, are implemented in the central unit 2. Furthermore, a fully automated pipeline for training and deploying the models into the respective devices is implemented, which is used for the regular and recurring parameterization, validation and updating of models or model parameters. The aging state model may be used regularly, i.e., for example, after the respective evaluation period has elapsed, in order to determine the instantaneous aging state of the relevant vehicle battery 41 of the associated vehicle fleet based on the time profiles of the operating variables (in each case since the initial operation of the respective vehicle battery) and operating features determined therefrom. In other words, it is possible to determine an aging state of the relevant vehicle battery 41 based on the profiles of the operating variables of one of the vehicle batteries 41 of the motor vehicles 4 of the associated vehicle fleet 3 and the operating features resulting from these profiles of the operating variables.

The aging state (state of health, SOH) is the key variable to indicate a remaining battery capacity or remaining battery charge. The aging state represents a measure of the aging of the vehicle battery or of a battery module or of a battery cell and may be indicated as a capacity retention rate (SOH-C) or as an increase in internal resistance (SOH-R). The capacity retention rate SOH-C is given as the ratio of the measured instantaneous capacity to an initial capacity of the fully charged battery. The relative change in the internal resistance SOH-R increases with increasing aging of the battery.

Figure 2:
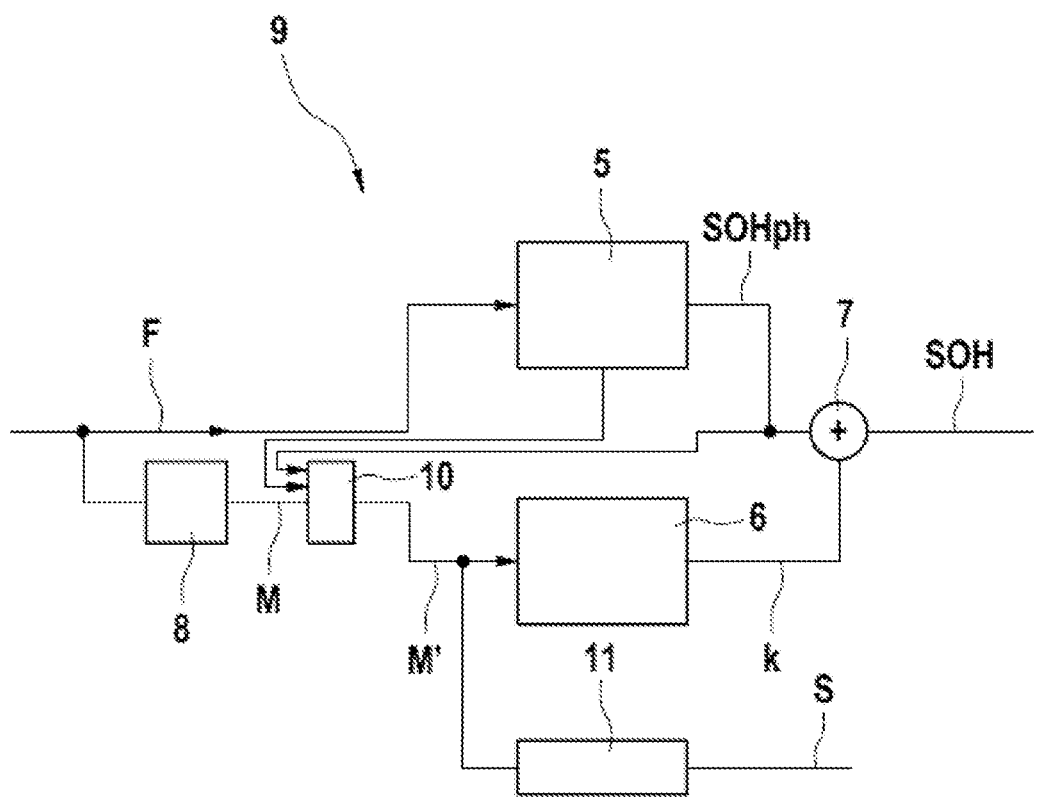
FIG. 2 shows a schematic illustration of a functional structure of a hybrid aging state model.

FIG. 2 schematically shows, by way of example, the functional structure of an embodiment of an exemplary data-based aging state model 9 structured in a hybrid manner. The aging state model 9 comprises a physical aging model 5 and a data-driven, preferably probabilistic, correction model 6.

The physical aging model 5 is a non-linear mathematical model based on differential equations. The evaluation of the physical aging model of the aging state model with operating variable profiles, in particular since the start of the service life of the device battery, results in an internal state of the equation system of the physical differential equations that corresponds to a physical internal state of the device battery. Since the physical aging model is based on physical and electrochemical principles, the model parameters of the physical aging model are variables that indicate physical properties.

The time series of the operating variables F are thus directly included in the physical aging state model 5, which is preferably designed as an electrochemical model and describes corresponding internal electrochemical states, such as layer thicknesses (e.g., SEI thickness), change in cyclable lithium due to anode/cathode side reactions, rapid consumption of electrolytes, slow consumption of electrolytes, loss of active material in anode, loss of active material in cathode, etc. . . . ), by means of non-linear differential equations and a multi-dimensional state vector.

The physical aging model 5 thus corresponds to an electrochemical model of the battery cells and of the cell chemistry. This model determines, depending on the operating variables F, internal physical battery states in order to provide a physically based aging state SOHph of the dimension of at least one in the form of the electrochemical states mentioned above, which are mapped linearly or non-linearly to a capacity retention rate (SOH-C) and/or an internal resistance increase rate (SOH-R) in order to provide the later as an aging state (SOH-C and SOH-R).

However, the model values for the physical aging state SOHph provided by the electrochemical model are inaccurate in certain situations and it is therefore provided to correct them with a correction variable k. The correction variable k is provided by the data-based correction model 6, which is trained by means of training data sets from the vehicles 4 of the vehicle fleet 3 and/or by means of laboratory data.

On the input side, the correction model 6 receives operating features M, which can be determined by feature engineering from the profiles of the operating variables F and can also comprise one or more of the internal electrochemical states of the differential equation system of the physical model. Furthermore, the correction model 6 may receive on the input side the physical aging state SOHph obtained from the physical aging model 5. The operating features M of the current evaluation period are generated in a feature extraction block 8 based on the time series of the operating variables F. The operating features M furthermore include the internal states from the state vector of the electrochemical physical aging model as well as, advantageously, the physical aging state SOHph.

From the operating variables F, operating features M relating to an evaluation period can be generated in the central unit 2 for each vehicle fleet 3 or in other embodiments even already in the respective motor vehicles 4. The evaluation period for determining the aging state may be a few hours (e.g., 6 hours) to several weeks (e.g., one month). A typical value for the evaluation period is one week.

The operating features M may, for example, comprise features relating to the evaluation period and/or accumulated features and/or statistical variables determined over the entire previous service life or aggregate variables. In particular, the operating features may comprise, for example: electrochemical states, such as SEI layer thickness, mass or quantity change of cyclable lithium due to anode/cathode side reactions, rapid absorption of electrolyte solvent, slow absorption of electrolyte solvents, lithium deposition, loss of active anode material and loss of active cathode material, information on impedances or the internal resistances, histogram features, such as temperature over state of charge, charging current over temperature and discharging current over temperature, in particular multi-dimensional histogram data with respect to the battery temperature distribution over the state of charge, the charging current distribution over the temperature and/or the discharging current distribution over the temperature, the current flow rate in ampere-hours, the accumulated total charge (Ah), an average increase in capacity during a charging operation (in particular for charging operations in which the charge increase is above a threshold fraction [e.g., 20% $\Delta SOC$] of the total battery capacity), the charging capacity as well as an extreme value (e.g., maximum) of the differential capacity during a measured charging operation with sufficiently large stroke of the state of charge (smoothed profile of dQ/dU: charge change divided by change in the battery voltage) or the accumulated driving power. These variables are preferably converted such that they optimally characterize the real usage behavior and are standardized in the feature space. The operating features M may be used altogether or only in part for the method described below.

For the determination of a corrected aging state SOH to be output, the outputs SOHph, k of the physical aging model 5 and of the data-based correction model 6, which is preferably designed as a Gaussian process model, are applied together. In particular, they can be added or otherwise also multiplied (not shown) in a summing block 7 in order to obtain the modeled aging state SOH to be output for a current evaluation period.

For anomaly detection, a variational autoencoder may be provided as an anomaly detection model 11 to which the operating feature point M is supplied. The anomaly detection model 11 may be designed with a variational autoencoder. The variational autoencoder is preferably trained in the central unit and, after transmitting the model parameters to the relevant vehicle(s), is evaluated in the vehicle in real time by evaluating a distance dimension, such as the Mahalanobis distance, in the latent state space of the variational autoencoder or, alternatively, a reconstruction error, in particular by a threshold comparison. As a result of the threshold comparison, an error signal S is output.

In addition to one or more of the operating features M, which may already result from the implementation of the hybrid aging state model, it is an essential part of the method described herein to perform an anomaly detection by means of a centrally trained anomaly detection model, in particular a variational autoencoder based on various domain-based operating features resulting from the operation of the energy store and, where applicable, the implementation of the aging state model described above. The operating features may also include the modeled aging state.

The variational autoencoder of the anomaly detection model 11 may be determined based on operating variable profiles of the plurality of vehicle batteries 41 of the vehicle fleet 3, in particular at different cyclic and/or calendar aging states. The operating features may furthermore comprise: statistical moments of the distributions of voltage, current or temperature (such as expected value, variance, skewness, . . . ) as well as model-endogenous parameters and/or model-exogenous parameters of electrochemical models, such as porosities, SEI thicknesses, available lithium, diffusion coefficients, contact resistances, available active material, electrolyte concentrations, as well as histogram-based features, such as SOC temperature histograms, assessed with penalty functions to infuse domain knowledge.

Figure 3:
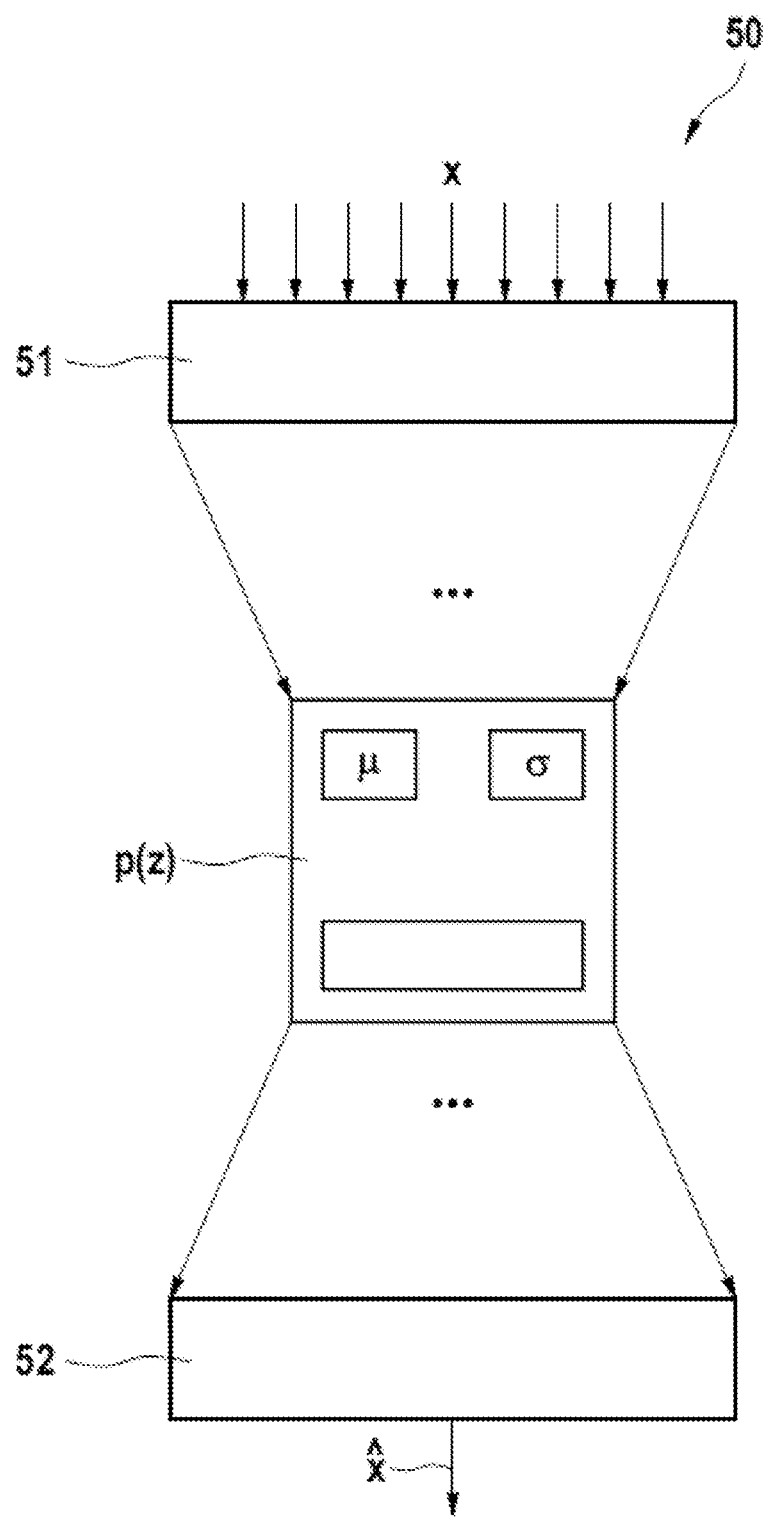
FIG. 3 shows a schematic illustration of a variational autoencoder.

FIG. 3 schematically shows a variational autoencoder 50 with an encoder 51 and a decoder 52. The encoder 51 and decoder 52 are connected via a latent state space. The encoder 51 and decoder 52 may be designed as a deep neural network or with another data-based regression model. The variational autoencoder 50 is trained to associate an input variable vector x with an identical output variable vector 2, wherein a distribution of resulting latent state vectors in the latent state space follows a predetermined distribution, in particular a Gaussian distribution.

The training of the variational autoencoder 50 takes place on the one hand to map the input variable vector to an output variable vector and such that the encoder 51 is trained to obtain a predetermined distribution of the latent state vector in a latent state space. The training takes place based on a loss function that takes into account both the reconstruction error and a Kullback-Leibler divergence. Overfitting of the latent state space is thereby avoided or suppressed.

As described above, a solvable variational inference may be performed in order to determine $\mu_x$ and $\sigma_x$ by minimizing Kullback-Leibler divergence:

$$\mathrm{argmin}\ E_{z \sim q(Z|X)}[\log p(x|z)] - KL(q(z|x)\|p(z))$$

The first term log p(x|z)] represents the reconstruction probability that penalizes the reconstruction error, and the second term KL(q(z|x)∥p(z)) ensures that the distribution q(z|x) resembles the true prior distribution of p(z).

The loss function 1 to be minimized is defined for c>0 as follows:

$$l = c\|x - \hat{x}\|^2 + KL(N(\mu_x, \sigma_x)\|N(0, I))$$

The training takes place based on training data sets with operating feature points where the loss function is successively minimized by training decoder and encoder by means of conventional training methods.

An anomaly or a suspected error can be detected with the variational autoencoder by evaluating, for an operating feature point to be evaluated, a distance dimension with respect to the distribution in the latent state space or the reconstruction error from operating features determined from operating variable profiles of an energy store. In particular, an anomaly may be detected if a deviation between the current evaluation and the distance dimension or reconstruction error is detected that is greater than a predetermined error threshold. The error threshold results from an evaluation of the available training data.

Figure 4:
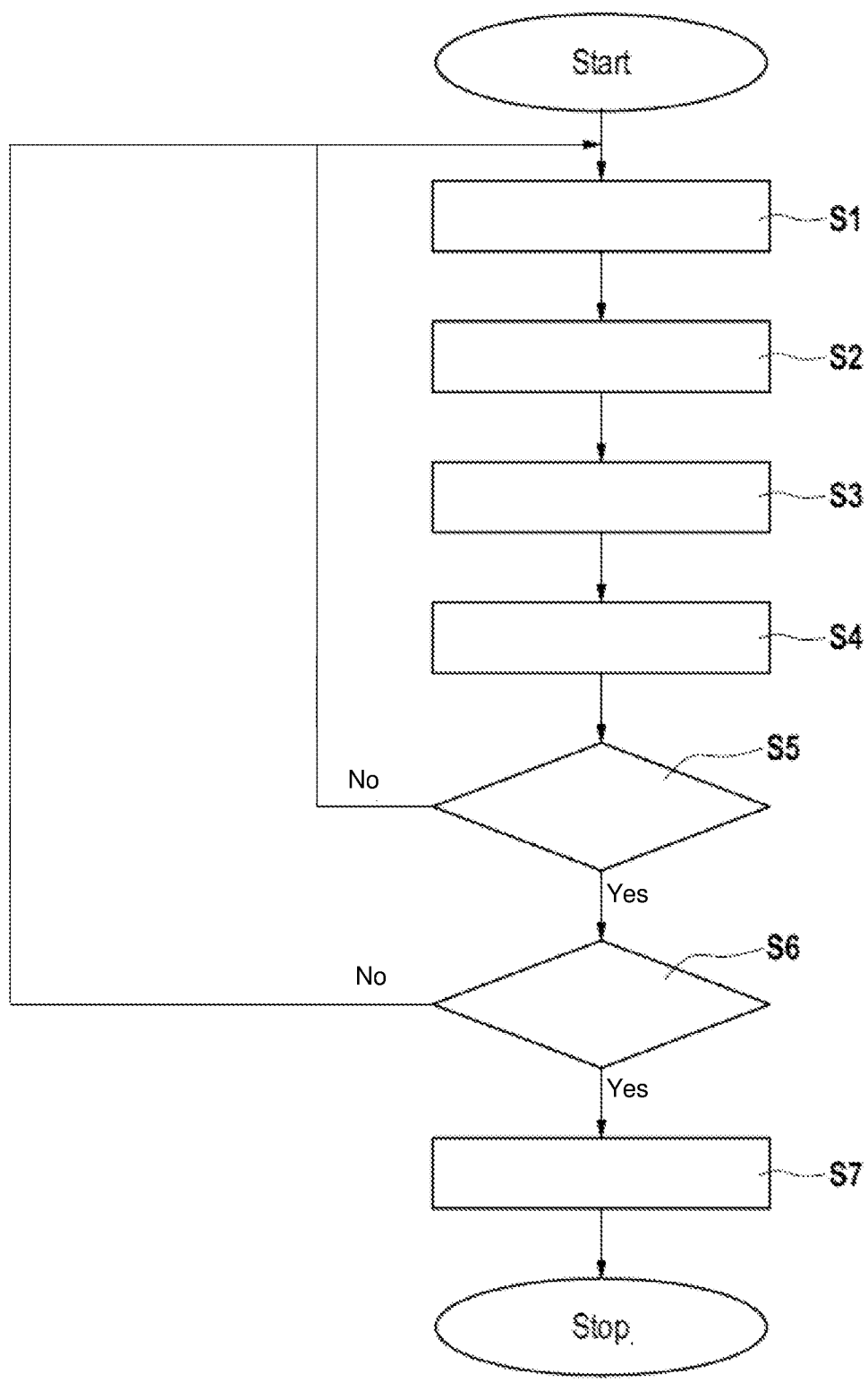
FIG. 4 shows a flow chart illustrating a method for determining an anomaly of the behavior of an electrical energy store.

FIG. 4 shows a flow chart illustrating a method for anomaly detection of behavior of vehicle batteries 41 as an example of energy stores of vehicles 4 of a vehicle fleet 3 (corresponding to the devices of the plurality of devices). The method is performed in the central unit 2. The usual execution frequency of the method is battery-specific and may correspond to a weekly execution as a standard case when no acute anomaly is suspected.

In step S1, a conventional operation of the hybrid aging model of the central unit 2 takes place. In ongoing operation, continuous profiles of operating variables, such as the battery current, the battery voltage, the state of charge and the battery temperature are transmitted from each of the vehicles 4 of the vehicle fleet 3 to the central unit 2. The error feature determined as described above may be determined in both the vehicle 4 and the central unit 2.

In step S2, the operating variable profiles are evaluated at predetermined times to determine operating features M for each of the relevant device batteries 41. This may takes place as part of the evaluation of the aging state model. To this end, a physical aging state SOHph is directly determined from the operating variable profiles by the physical aging model 5 and operating features M are updated or determined as described above.

The one or more operating features M may serve as an input variable vector x for the variational autoencoder 50. The one or more operating features M are supplied in step S3 to the variational autoencoder 50 as an anomaly detection model 11, which has previously been trained with operating feature points of a plurality of properly operating vehicle batteries 41, and evaluated.

By evaluating the variational autoencoder 50 with the operating feature point M of the relevant vehicle battery 41 to be evaluated, a resulting distribution in the latent state space in the form of information of a mean vector and of the variance vector may be determined and assessed by means of the Mahalanobis distance to a centroid of the distribution in the latent state space (of the normal cluster), which resulted from the evaluations of the available training data sets for the variational autoencoder 50. The resulting degree of deviation between the centroid and the current latent state vector of the vehicle battery 41 (by evaluating the input variable vector of the operating feature point) may be determined by means of the Mahalanobis distance.

In step S4, the degree of deviation, advantageously the Mahalanobis distance, is compared with an error threshold. The error threshold may be fixed or determined from the current training state of the variational autoencoder and the training data sets used for this purpose.

The error threshold for detecting an anomaly is determined as a design parameter based on an acceptable predetermined probability of false-positive detection, e.g., a predetermined maximum value, such as, for example, 1%. This false-positive probability is used to evaluate and compare a frequency distribution in order to dimension the error threshold. The frequency distribution results from the distribution in the latent state space of the normal cluster of all training data sets and can be characterized via the resulting Mahalanobis distance.

By integrating over the frequency distribution, the probability can be determined. By adjusting the error threshold, the error threshold can be set exactly such that the desired criterion, namely, e.g., the 1% (other specifications are also possible) false-positive probability, is sufficiently accurately fulfilled on the basis of all available training data.

The assessment of the distribution or the distances of the resulting latent state vectors in the latent state space preferably takes place by means of the Mahalanobis distance.

Figure 5:
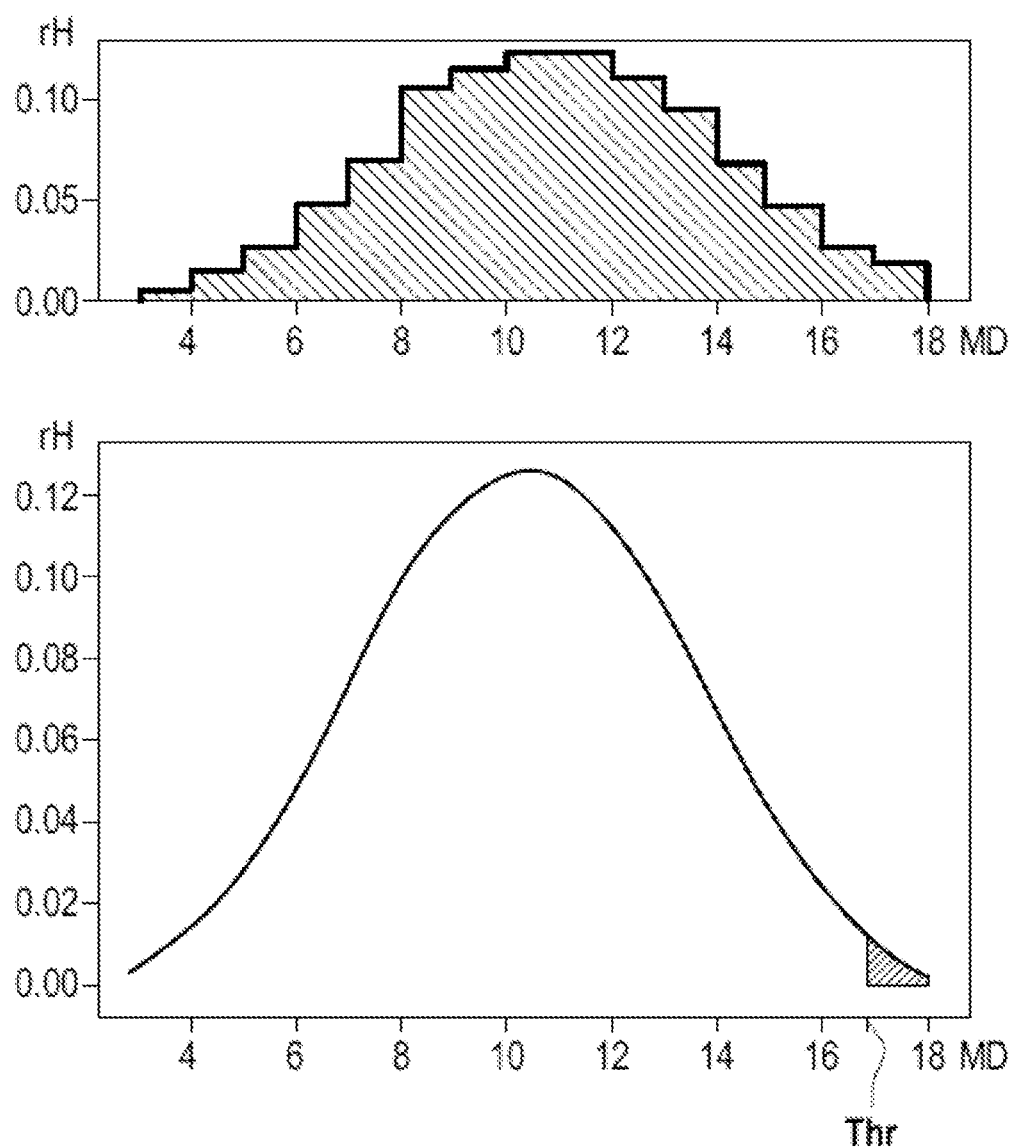
FIG. 5 shows a diagram illustrating the frequency distribution of a value of a degree of deviation, such as the Mahalanobis distance.

This is illustrated in FIG. 5 by way of example. Here, the relative frequencies rH of the occurrence of certain value ranges of the degrees of deviation or the Mahalanobis distance MD are shown. The shaded area corresponds to the area of the false-positive detections. The error threshold Thr indicates the limit of the training data sets that have 1% of the highest degrees of deviation, e.g., on the basis of the Mahalanobis distance or the reconstruction errors.

If it is determined in step S5 that the error threshold is exceeded by the degree of deviation of the distribution in the state space or by the reconstruction error (alternative: Yes), the method is continued with step S6, otherwise (alternative: No) a jump back to step S1 occurs. This threshold comparison preferably takes place in the vehicle. Since the variational autoencoder has learned a distribution in the robust latent state space, robust execution in the vehicle is possible in real time even if there is no cloud connection.

In step S6, based on one or more domain models, detection of an anomaly or of the suspected error is made plausible by checking whether a plausibility condition for the presence of the error is fulfilled. These domain models advantageously include rule-based damage directions of at least one feature.

To this end, the operating features of the current operating feature point for the feature distributions of the operating features taken into account, at least mean and standard deviation, are assessed based on the last parameterization of the variational autoencoder. The assessment may thus take place on the basis of the covariance matrix.

In this case, a load-relevance direction is modeled. If the current operating feature of the operating feature point exceeds or falls below a limit value (depending on the direction of the higher load), e.g., a mean, the plausibility condition is fulfilled and the anomaly or the suspected error is successfully made plausible.

For example, if the mean of the AH throughput at 10.000 AH is a standard deviation of 200 AH and the mean of the aging state, evaluated on the basis of comprehensive fleet data, e.g., by means of the described aging model, at 10.000 AH is an SOH=0.9, the detected error can be discarded, despite detection of an anomaly at a current AH throughput of 10.000 AH and an aging state of SOH=0.94, because aging is better than fleet average and consequently no damage exists despite data-based anomaly.

If the operating feature of the AH throughput is 10,000 AH and the aging state is 0.8, the suspected error is confirmed and an error is detected since too much aging is present, which does not match the usage pattern. The evaluation generally takes place in a multi-dimensional feature space in which redundant information about a PCA transformation can advantageously be eliminated.

The evaluation can on the basis of the covariance matrix or the Mahalanobis distance in the feature space of the operating features, taking into account the aging states, wherein a load-relevance direction or a direction of the degree of anomaly is associated with each operating feature and aging state.

At least one operating feature M can be evaluated in this case. The assessment preferably takes place on the basis of a plurality of operating features, for example in order to assess the suspected error or the anomaly with respect to its damage relevance, e.g. with regard to calendar aging, cyclic aging and special damage cases, such as overheating by, for example, by re-rating setpoint in the course of temperature loads.

Overall, the assessment takes place on the basis of one or more plausibility conditions, with which it is possible to assess whether the anomaly or the suspected error is critical. This may advantageously likewise be carried out with the Mahalanobis distance or alternatively via mean comparison and variance comparison of the individual operating features, wherein one damage direction is respectively predetermined. The plausibility conditions may be predetermined as expert knowledge.

If it is ascertained in step S6 that the detected anomaly is confirmed as an actual anomaly by the plausibility condition (alternative: Yes), an error is signaled in step S7. Otherwise (alternative: No), a jump back to step S1 occurs.

This step is intended to exclude or significantly reduce false-positive results. For example, if a vehicle is stationary for an extended period of time, e.g., for several years, the variational autoencoder 50 could ascertain an anomaly due to the data situation. However, since this is not likely to be critical for the vehicle battery 41 if the aging state of the battery is within an expected range, the detected anomaly is not confirmed.

The variational autoencoder 50 can be retrained when new operating feature points exist. This may take place in conjunction with the determination of an updated error threshold.

While the training of the variational autoencoder and the determination of the error threshold are performed in the central unit 2, the method for anomaly detection may take place in the vehicle after transmitting model parameters, which define the data input of the variational autoencoder, and the error threshold to the relevant vehicle, so that there is no dependence of the anomaly detection function on a communication connection to the central unit 2 (cloud).

The evaluation with regard to a detection of an anomaly may be performed regularly and in particular simultaneously with the determination of the aging state by means of the hybrid aging state model 9 since at this time, the operating feature points M required for the correction model 6 are determined from the newly sensed operating variable profiles.

The variational autoencoder is regularly re-trained in the central unit 2 based on all re-acquired normal data, and the error threshold is re-parameterized based on the predetermined false-positive probability. An automated transmission of the model parameters of the variational autoencoder to the vehicle may subsequently be performed.

Figure 6:
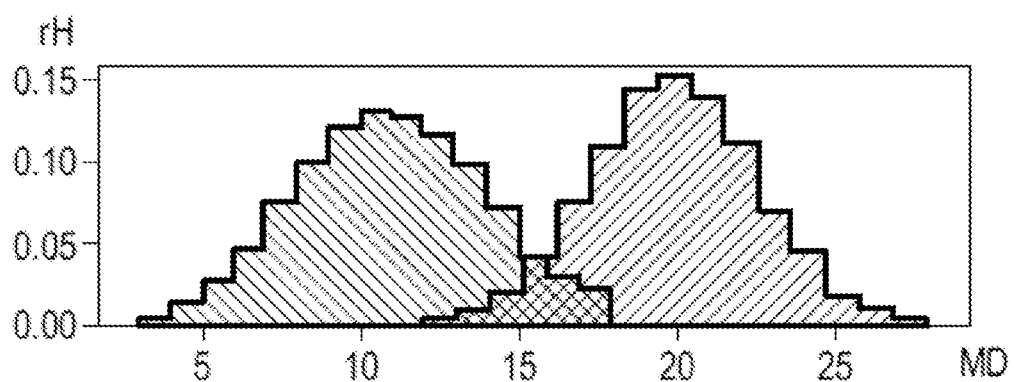
FIG. 6 shows a diagram illustrating the frequency distribution of a value of a degree of deviation for training data sets for proper vehicle batteries and faulty vehicle batteries.

With reference to FIG. 6, the error threshold can additionally also be determined after the detection of error cases, based on a frequency distribution H1, resulting from the training data sets of error-free vehicle batteries, of the degree of deviation or the reconstruction error for error-free vehicle batteries and a frequency distribution H2 of the degree of deviation or the reconstruction error for faulty vehicle batteries. The error threshold may then be determined, for example, as the intersection of the frequency distributions, as an F score, or generally from the profiles of the frequency distributions H1, H2.

Furthermore, a classification model may be trained based on the operating feature points of proper and faulty vehicle batteries, preferably with logistic regression in order to assess false positives and false negatives to derive an ROC analysis. Advantageously, this model may be executed in addition to the variational autoencoder or alternatively in the vehicle. The error threshold can now be designed on the basis of the false positives and the false negative rate.

Figure 7:
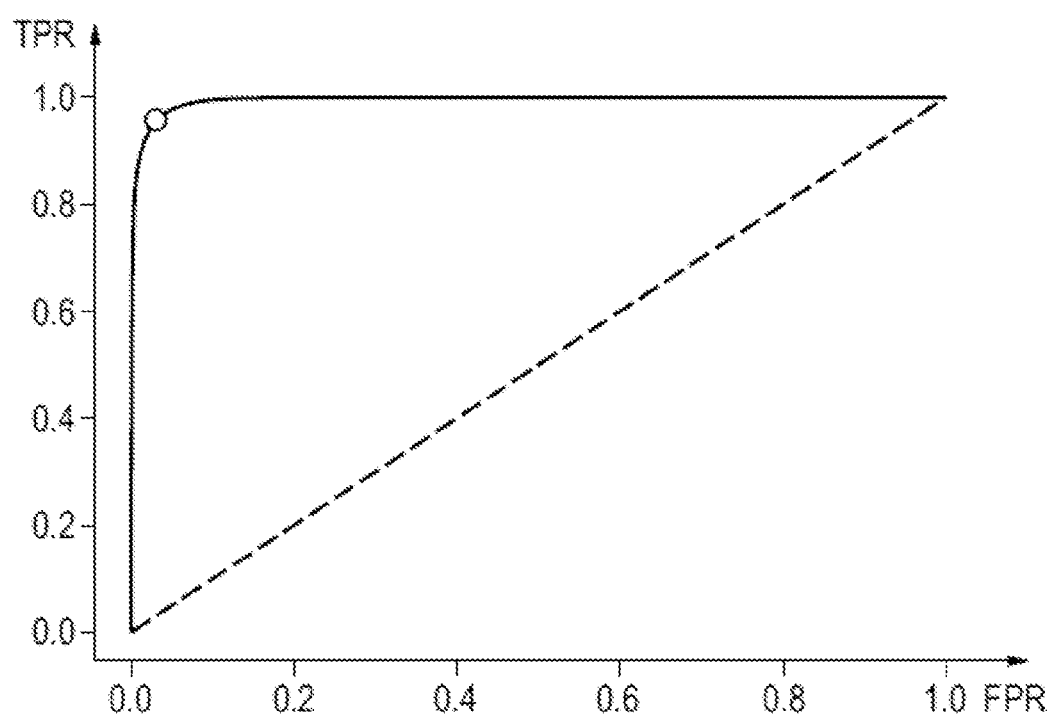
FIG. 7 shows an ROC diagram of the frequencies of a distance dimension or reconstruction error of proper and faulty vehicle batteries.

As can be seen in the ROC (receiver operating characteristics) diagram of FIG. 7, this may be carried, e.g., by using the minimum distance of the ROC curve to the point (FPR=0|TPR=1) in order to derive an optimal error threshold. An ROC diagram is a diagram in which the true-positive rate TPR is plotted against the false-positive rate. Values for FPR and TPR result which are associated with a degree of deviation or a reconstruction error as the error threshold according to the frequency distributions of FIG. 6. Here, as with the variational autoencoder, the distance dimension, such as the Mahalanobis distance, is used as a feature for designing the limit value. The classifier may comprise a logistic regression model.

The error threshold in the vehicle can subsequently be adjusted accordingly.

The anomaly detection may furthermore take place by means of the variational autoencoder. In addition, supplementarily or alternatively, the classifier may also be used to detect the anomaly.

What is claimed is:

1. A computer-implemented method for determining an error of a behavior of an electrical energy store in a technical device, comprising:
   sensing an operating variable profile of at least one operating variable of the electrical energy store;
   determining at least one operating feature from the operating variable profile of the at least one operating variable of the electrical energy store;
   evaluating a variational autoencoder with a supplied input variable vector, which comprises an operating feature point from the at least one operating feature, in order to determine a degree of deviation from a distribution in a latent state space or a reconstruction error;
   detecting the error of the behavior depending on (i) the degree of deviation or the reconstruction error, and (ii) a predetermined error threshold; and
   signaling the error of the behavior.

2. The method as claimed in claim 1, wherein determining the at least one operating feature comprises:
   determining the at least one operating feature as an aggregate variable from the operating variable profile of the at least one operating variable of the electrical energy store.

3. The method as claimed in claim 1, further comprising:
   determining the predetermined error threshold based on an acceptable predetermined false-positive probability,
   wherein the predetermined false-positive probability indicates a relative limit value, what proportion of the evaluations may maximally result in an incorrectly detected error of the behavior,
   wherein a frequency distribution function is determined from frequencies of occurrence of a particular value or value range of the degree of deviation of the distribution in the latent state space or of the reconstruction error in an evaluation of available training data sets, and
   wherein the predetermined error threshold results as a value of the degree of deviation of the distribution in the latent state space or the reconstruction error that is less than the degrees of deviation or reconstruction errors of a number of training data sets that corresponds to a proportion of all the available training data sets that corresponds to the predetermined false-positive probability.

4. The method as claimed in claim 1, wherein following a presence of field data of errors in the energy stores, the predetermined error threshold is determined based on a false-positive frequency distribution and a false-negative frequency distribution resulting from training data sets of error-free energy stores.

5. The method as claimed in claim 1, wherein the error of the behavior is detected when the degree of deviation of the distribution in the latent state space or the reconstruction error exceeds the predetermined error threshold.

6. The method as claimed in claim 1, further comprising:
   signaling the error of the behavior only when a plausibility condition for a presence of the error of the behavior is fulfilled.

7. The method as claimed in claim 6, further comprising:
   determining the plausibility condition as a comparison of one or more operating features of the operating feature point of the energy store with a respective mean of the one or more operating features; and
   identifying the plausibility condition as being fulfilled when at least one of the one or more operating features exceeds the respective mean.

8. The method as claimed in claim 1, wherein:
   the method is performed in a respective technical device,
   the variational autoencoder is regularly re-trained externally and model parameters of the variational autoencoder are transmitted to the technical device, and
   the predetermined error threshold is determined externally and transmitted to the respective technical device in order to be used to determine the error of the behavior.

9. The method as claimed in claim 1, wherein:
   the degree of deviation is determined as a Euclidean distance between a centroid of latent state vectors, which result from the evaluations of input variable vectors of training data sets in the trained variational autoencoder, and the latent state vector for the input variable vector to be evaluated or as a Mahalanobis distance between the centroid of the latent state vectors, which result from the evaluations of the input variable vectors of the training data sets in the trained variational autoencoder, and the latent state vector for the input variable vector to be evaluated, or
   the reconstruction error is determined as a Euclidean distance between an output variable vector of the variational autoencoder and the input variable vector to be evaluated.

10. The method as claimed in claim 1, further comprising:
    using an aging state model that uses the at least one operating feature to determine an aging state in a data-based model.

11. The method as claimed in claim 1, wherein signaling the error of the behavior includes an automated shutdown of the technical device, transitioning of the energy store into a safe state via rapid discharge, or a scheduling of a workshop visit for inspection.

12. The method as claimed in claim 1, wherein the energy store is used to operate a motor vehicle, a pedelec, an aircraft, a drone, a machine tool, a consumer electronics device, a mobile phone, an autonomous robot, and/or a household appliance.

13. The method as claimed in claim 1, wherein a computer program comprises instructions that, when the computer program is executed by at least one data processing device, cause the at least one data processing device to perform the method.

14. The method as claimed in claim 13, wherein a non-transitory machine-readable storage medium comprises instructions that, when executed by at least one data processing device, cause the at least one data processing device to perform the method.

15. An apparatus for determining an anomaly of a behavior of an electrical energy store in a technical device, the apparatus comprising:
    a central unit configured to:
        sense an operating variable profile of at least one operating variable of the electrical energy store;

determine at least one operating feature from the operating variable profile of the at least one operating variable of the electrical energy store;

evaluate a variational autoencoder with a supplied input variable vector, which comprises an operating feature point from the at least one operating feature, in order to determine a degree of deviation from a distribution in a latent state space or a reconstruction error;

detect the anomaly of the behavior depending on (i) the degree of deviation or the reconstruction error, and (ii) a predetermined error threshold; and signal the anomaly of the behavior.

* * * * *